(12) United States Patent
Bender et al.

(10) Patent No.: US 10,573,826 B2
(45) Date of Patent: Feb. 25, 2020

(54) ORGANIC LIGHT EMITTING DIODE DEVICE COMPRISING BORON SUBPHTHALOCYANINE

(71) Applicants: Timothy P. Bender, Toronto (CA); Trevor Plint, Toronto (CA); Jeffrey S. Castrucci, Toronto (CA)

(72) Inventors: Timothy P. Bender, Toronto (CA); Trevor Plint, Toronto (CA); Jeffrey S. Castrucci, Toronto (CA)

(73) Assignee: THE GOVERNING COUNCIL OF THE UNIVERSITY OF TORONTO, Toronto, Ontario (CA)

( * ) Notice: Subject to any disclaimer, the term of this patent is extended or adjusted under 35 U.S.C. 154(b) by 0 days.

(21) Appl. No.: 15/117,645

(22) PCT Filed: Feb. 10, 2015

(86) PCT No.: PCT/CA2015/000075
§ 371 (c)(1),
(2) Date: Aug. 9, 2016

(87) PCT Pub. No.: WO2015/117234
PCT Pub. Date: Aug. 13, 2015

(65) Prior Publication Data
US 2016/0351834 A1    Dec. 1, 2016

Related U.S. Application Data

(60) Provisional application No. 61/937,899, filed on Feb. 10, 2014.

(51) Int. Cl.
| H01L 51/50 | (2006.01) |
| H01L 51/00 | (2006.01) |
| C09K 11/06 | (2006.01) |
| H01L 51/56 | (2006.01) |

(52) U.S. Cl.
CPC .......... *H01L 51/0078* (2013.01); *C09K 11/06* (2013.01); *H01L 51/0036* (2013.01);
(Continued)

(58) Field of Classification Search
CPC ............................ H01L 51/0078; C09K 11/09
See application file for complete search history.

(56) References Cited

U.S. PATENT DOCUMENTS

2004/0183082 A1* 9/2004 Yamazaki ........... H01L 51/5036
                                                            257/79
2006/0022590 A1* 2/2006 Aziz .................... H01L 51/5088
                                                            313/506
(Continued)

FOREIGN PATENT DOCUMENTS

CA        2514506 C      3/2015
WO    2006055415 A1      5/2006

OTHER PUBLICATIONS

Morse et al. Boron Subphthalocyanines as Organic Electronic Materials. ACS Appl. Mater. Interfaces 2012, 4, (5055-5068).*
(Continued)

*Primary Examiner* — Eric A. Ward
*Assistant Examiner* — Eric K Ashbahian
(74) *Attorney, Agent, or Firm* — Norton Rose Fulbright Canada LLP

(57) ABSTRACT

An organic light emitting diode device comprising: a light emitting layer or layers combining both an emissive material comprising a boron subphthalocyanine, or first emitting layer component, that emits substantially orange light; and an emissive material emitting blue light, or second emitting layer component; wherein in combination, the first emitting layer component and the second emitting layer component, in combination, produces an overall white or near-white light emission.

17 Claims, 7 Drawing Sheets

100

| 102 Cathode |
| 104 First Emissive Component |
| 106 Second Emissive Component |
| 108 Anode |
| 110 Substrate |

(52) U.S. Cl.
CPC ...... *H01L 51/0037* (2013.01); *H01L 51/0059*
(2013.01); *H01L 51/504* (2013.01); *C09K
2211/1007* (2013.01); *C09K 2211/1014*
(2013.01); *C09K 2211/1022* (2013.01); *C09K
2211/1029* (2013.01); *H01L 51/5056*
(2013.01); *H01L 51/5072* (2013.01); *H01L
51/56* (2013.01)

(56) References Cited

U.S. PATENT DOCUMENTS

2009/0026937 A1*  1/2009  Kinoshita ............. H01L 51/005
                                                        313/504
2014/0001443 A1*  1/2014  Lee ...................... C07D 471/04
                                                        257/40

OTHER PUBLICATIONS

Morse et al. Pentafluorophenoxy Boron Subphthalocyanine (F5BsubPc) as a Multifunctional Material for Organic Photovoltaics. ACS Appl. Mater. Interfaces 2014, 6, (1515-1524).*
Pentafluorophenoxy Boron Subphthalocyanine As a Fluorescent Dopant Emitter in Organics Light Emitting Diodes. ACS Appl. Mater. Interfaces vol. 2, No. 11, 2010 (3147-3152).*
WIPO, International Search Report and Written Opinion for PCT Application No. PCT/CA2015/000075 dated May 8, 2015.
Morse et al., Boron Subphthalocyanines as Organic Electronic Materials, ACS Applied Materials and Interfaces, pp. 5055-5068, 2012, vol. 4(10), American Chemical Society.

* cited by examiner

FIGURE 7
(a) 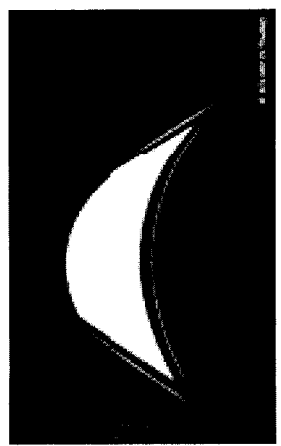
(b) 
(c) 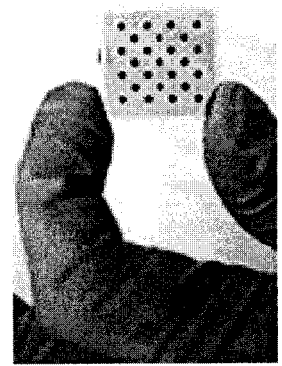

ORGANIC LIGHT EMITTING DIODE DEVICE COMPRISING BORON SUBPHTHALOCYANINE

FIELD OF THE INVENTION

This invention relates generally to lighting fixtures or luminaires, and more particularly, an organic light emitting diode device comprising boron subphthalocyanine.

BACKGROUND OF THE INVENTION

Organic light emitting diodes (OLEDs) are light emitting diodes (LEDs) where the emissive electroluminescent layer is a film of organic compound(s) that emits light in response to an electric current.

OLEDs are used on a number of display applications, ranging from mobile devices, television displays, and digital cameras, with their use expanding into further potential uses as the technology develops. OLEDs provide certain advantages over traditional lighting solutions, such as incandescent lights, including lighter weights, lower drive voltages, greater energy efficiency higher luminance, wider viewing angles, more flexible displays, ease of recycling, and thinner displays, among others.

OLEDs may be constructed to be comprised of a single layer or multiple layers of materials, depending on the application and particular desired characteristics. For example, the emissive layer may be used individually, in a bilayer structure, or in a trilayer structure, among others. The different layers may include different materials to provide particular characteristics for various reasons (e.g. improved efficiency). OLEDS may be fabricated on a number of different substrates, including, but not limited to, various types of glass and plastic. There may be more than one emissive layer. An example two layer structure could include separate hole transporting and electron transporting layers where the recombination of holes and electrons results in the emission of light.

White OLEDs (WOLEDs) are OLEDs that emit white or near-white light through a variety of methods. A method to emit white or near-white light is to combine different colours of light to formulate white light (e.g. combining red, green and yellow, or various combinations of complementary colors). In particular, complementary colors blue and orange can be combined, in various proportions, to create white or near-white light.

White or near-white light may encompass range of colors—the 'whiteness' of the light may be quantified through a term known in the art as 'color temperature' which may range from warmer, orange-tinted light at lower color temperatures to colder, blue-tinted light at higher color temperatures (e.g., a higher correlated color temperature (CCT)). Traditional incandescent light sources provide warm orange tinted white light, and white fluorescent tubes and bulbs (including compact fluorescent bulbs) produce colder white light.

WOLEDs may be suitable, in particular, for lighting applications. Alternatives to lighting from incandescent lights may be urgently needed as incandescent types are being phased out in Canada and around the world.

Further, given the strong regulations in the European Union, there is a significant commercial potential in supplying WOLEDs to the international market.

A class of organic materials known as boron subphthalocyanines (BsubPcs) has been explored for use in WOLEDs. The subphthalocyanine of boron contains three repeating isoindoline units whereas all other metal(loid)s form normal phthalocyanines with four isoindoline units.

Subphthalocyanine adopts a non-planar molecular conformation referred to as a bowl. Protruding from the convex side of the bowl is an axial substituent (X or Ra).

The first BsubPc, Cl-BsubPc was isolated in a 1% yield in 1973 and its molecular structure unambiguously determined in 1974. BsubPcs remained unexplored until the 1990s when Kobayashi expanded the chemistry of BsubPcs followed by Torres in the 2000s. Prior to 2007, BsubPcs remained relatively understudied as functional organic electronic materials as they suffered from a lack of reproducible preparatory methods and contradictory evidence regarding their basic properties. Recently, BsubPcs have begun to be applied in functional devices.

BsubPcs has been engineered into many different forms including dyes, sublimates and engineered crystals. However, the vast majority of cases (>90%) use the prototypical Cl-BsubPc, which lacks chemical variation and tunability.

An extensive review of BsubPcs in organic electronic devices highlighting the use of Cl-BsubPc and the need to study other derivatives was published. Other derivatives, for example, phenoxy-BsubPcs, have been found to be easily made and allow for considerable variability including physical and electronic properties.

A new solution is thus needed for overcoming the shortfalls of the materials currently used in the market.

REFERENCES

Morse, G. E.; Gantz, J. L.; Steirer, K. X.; Armstrong, N. R.; Bender, T. P.*; Appl. Mater. & Inter., just accepted, DOI: 10.1021/am404179z. (b) Helander, M. H.; Morse, G. E.; Qiu, J.; Castrucci, J.; Bender, T. P.*; Lu, Z. H.; Appl. Mater. & Inter., 2010, 11(2), 3147-3152. (c) Morse, G. E.; Helander, M. H.; Maka, J.; Lu, Z. H.; Bender, T. P.*; Appl. Mater. & Inter., 2010, 2(7), 1934-1944; Meller, A.; Ossko, A.; Monatsh. Chem., 1972, 103, 150-155; Kietabil, H.; Monatsh. Chem., 1974, 105, 405; Kobayashi, N.; Kondo, R.; Nakajima, S.; Osa, T.; J. Am. Chem. Soc., 1990, 112(26), 9640-9641; Kobayashi, N.; Ishizaki, T.; Ishii, K.; Konami, H.; J. Am. Chem. Soc., 1999, 121(39), 9096-9110; Torres, T.; Angew. Chemie, Int. Ed., 2006, 45, 2834-2837; Morse, G. E.; Castrucci, J. S.; Helander, M. H.; Lu, Z. H.; Bender, T. P.*; Appl. Mater. Inter., 2011, 3, 3538-3544; Palomares, E.; Martinez-Diaz, M. V.; Torres, T.; Coronado, E.; Adv. Funct. Mater., 2006, 16, 1166-1170; Chen, Y-H.; et al.; Org. Electron., 2010, 11, 445-449; Renshawa, C. K.; Xua, X.; Forrest, S. R.; Org. Electron., 2010, 11, 175-178; Gommans, H.; et al.; Adv. Func. Mater., 2009, 19, 3435-3439; Morse, G. E.; Bender, T. P.*; Appl. Mater. Inter., 2012, 4(10), 5055-5068; Reineke, S.; Thomschke, M.; Lüssem, B.; Leo, K.; Rev. Mod. Phys., 2013, 85, 1245-1293; Chang, Y-L.; Lu, Z-H.; J. Display Tech., 2013, 9(6), 459-468; Viénot, F.; Durand, M.-L.; Mahler, E., J. of Modern Optics 2009, 56 (13), 1433-1446; Knez, I., J. of Environmental Psychology 2001, 21 (2), 201-208; Maclean's, Jan. 6, 2014, 122; Wagner, H.; Loutfy, R.; Hsiao, C-K.; J. Mat. Sci., 1982, 2781-2791; Kanno, H.; Holmes, R.; Sun, Y.; Kena-Cohen, S.; Forrest, S. R.; Adv. Mater., 2006, 18(3) 339-342; Reineke, S.; et al., Nature, 2009, 459, 234-238; Qi, X.; Slootsky, M.; Forrest, S. R.; Appl. Phys. Lett., 2008, 93(19), 193306-1-193306-3; T. Lee et al., Appl. Phys. Lett., 2008, 92(4), 043301-1-043301-3; Sun, Y.; et al., Nature, 2006, 440, 908-912; D'Andrade, B.; Holmes, R.; Forrest, S. R.; Adv. Mater., 2004, 16(7), 624-628; Chang, Y-L.; et al., Adv. Funct. Mater., 2013, 23(6), 705-712; Kuwabara, J.; Kanbara, T., J. Photopolym. Sol. Technol., 2008, 21 (3), 349-353; Ho, C.-L; Wong, W.-Y., RSC Polym. Chem. Ser., 2012, 2 (Molecular Design and Applications of Photofunctional Polymers and Materials), 1-30; Cao, H.; et al., J. Mater. Chem. C, 2013, 1(44), 7371-7379; Kappaun, S.; et al., Chem, Mater., 2007, 19(6), 1209-1211; Ko, M.-J.; Seo, J.-H.; Kim, Y. K.; Ha, Y., Mol. Cryst. Liq. Cryst., 2008, 492, 328-336; Leem, D.-S.; et al., J. Mater. Chem. 2009, 19(46), 8824-8828. (e) Zhu, M.; at al., J. Mater. Chem. 2012, 22 (2), 361-366; Chen, Y.-L.; et al., Inorg. Chem., 2005, 44 (12), 4287-4294; Rossbach, R.; et al., J. Cryst. Growth, 2008, 310 (23), 5098-5101; Chen, Y.-Y.; Lin, H.-C., J. Polym. Sci., Part A: Polym. Chem., 2007, 45 (15), 3243-3255; Fujiu, A.; Frolov, S. V.; Vardeny, Z. V.; Yoshino, K., Jpn. J. Appl. Phys., Part 2, 1998, 37 (6B), L740-L742; Tasch, S.; Graupner, W.; Leising, G.; Pu, L.; Wagner, M. W.; Grubbs, R. H., Adv. Mater., 1995, 7 (11), 903-6; Tasch, S.; et al., Appl. Phys. Lett., 1997, 71 (20), 2883-2885; US patents: (a) U.S. Pat. No. 7,713,499, May 11, 2010, (b) U.S. Pat. No. 7,517, 928, Apr. 14, 2009, (c) U.S. Pat. No. 7,402,700, Jul. 22, 2008, (d) U.S. Pat. No. 7,402,699, Jul. 22, 2008, (e) U.S. Pat. No. 7,390,599, Jun. 24, 2008, (f) U.S. Pat. No. 7,348,447, Mar. 25, 2008, (g) U.S. Pat. No. 7,238,456, Jul. 3, 2007.

SUMMARY OF THE INVENTION

The present disclosure relates to an organic light emitting diode devices, and more particularly organic light emitting diode devices comprising at least one emitting layer that emits orange light and at least one emitting layer that emits blue light.

In an aspect, an organic light emitting diode device is provided, comprising: a light emitting layer or layers combining both: (i) an emissive material comprising a boron subphthalocyanine, or first emitting layer component, that emits substantially orange light; and (ii) an emissive material emitting blue light, or second emitting layer component; wherein the first emitting layer component and the second emitting layer component, in combination, produces a white or near-white light emission.

In another aspect, the white or near-white light emission is either a white emission or an orange-white emission.

In another aspect, relative amounts of the first emitting layer component and the second emitting layer component are adjustable to tune the spectrum of light.

In another aspect, the doping concentration of the boron subphthalocyanine is a percentage selected from a group consisting of 1%, 5%, 10%, 20% and 100%.

In another aspect, the doping concentration of the emissive material emitting blue light is a percentage selected from a group consisting of 1%, 5%, 10%, 20% and 100%.

In another aspect, the relative amounts of the first emitting layer component and the second emitting layer component are adjustable to tune the spectrum of light from white to orange-white.

In another aspect, said boron subphthalocyanine is used as an electron transporting material.

In another aspect, said boron subphthalocyanine is used as a hole transporting material.

In another aspect, said emissive material emitting blue light is used as an electron transporting material.

In another aspect, said emissive material emitting blue light is used as a hole transporting material.

In another aspect, the second emitting layer component comprises a standard triarylamine or TPD.

In another aspect, the boron subphthalocyanine and the emissive material emitting blue light are part of a host material, the host material being either inert or electroactive.

In another aspect, the boron subphthalocyanine is F5BsubPc, and the second emitting layer component consists of a standard triarylamine or TPD.

In another aspect, the first emitting layer component emits orange light with substantially orange colour characteristics having a narrow distribution.

The organic light emitting diode device of claim 13, wherein the ratio of F5BsubPc and triarylamine or TPD in the emitting layer is adjustable to produce orange-white emissions in a colour range of an incandescent light bulb.

In another aspect, the first emitting layer component operates as both an n-type charge carrier and as a fluorescent emitter.

In another aspect, an organic light emitting diode device is provided, comprising: a substrate, coated with indium tin oxide or another transparent conductive oxide; a conductive layer on the substrate comprising poly(3,4-ethylenedioxythiophene) poly(styrenesulfonate); a single organic light emitting layer combining both (i) an emissive and electron transporting material comprising a boron subphthalocyanine, or first emitting layer component, that emits substantially orange light; and (ii) an emissive and hole transporting material emitting blue light, or second emitting layer component; wherein in combination, the first emitting layer component and the second emitting layer produce an overall white light emission; an electron injection layer; a buffer layer; and a cathode layer.

In another aspect, a solid state lighting system is provided, comprising one or more organic light emitting diode devices described above.

In another aspect, a lighting system manufactured to include one or more organic light emitting diode devices, wherein the light emitting layer is manufactured having relative amounts of the first emitting layer component and the second emitting layer component tuned to produce a warm, orange-tinted light.

In another aspect, an organic light emitting diode device is provided, comprising: a substrate, coated with indium tin oxide or another transparent conductive oxide; a conductive layer on the substrate comprising poly(3,4-ethylenedioxythiophene) poly(styrenesulfonate); a single organic light emitting layer combining both (i) an emissive and hole transporting material comprising a boron subphthalocyanine, or first emitting layer component, that emits substantially orange light; and (ii) an emissive and electron transporting material emitting blue light, or second emitting layer component; wherein in combination, the first emitting layer component and the second emitting layer produce an overall white light emission; an electron injection layer; a buffer layer; and a cathode layer.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

BRIEF DESCRIPTION OF THE DRAWINGS

In the drawings, embodiments of the invention are illustrated by way of example. It is to be expressly understood that the description and drawings are only for the purpose of illustration and as an aid to understanding, and are not intended as a definition of the limits of the invention.

FIG. 7 includes sample photographs that show example applications of WOLED lights, according to some embodiments of the invention. FIG. 7(a) is a sample photograph showing of a flexible application of OLEDs, (b) is a sample photograph showing a potential OLED sign, and (c) is a sample photograph showing a solar cell fabricated from BsubPcs.

DETAILED DESCRIPTION

Figure 1:
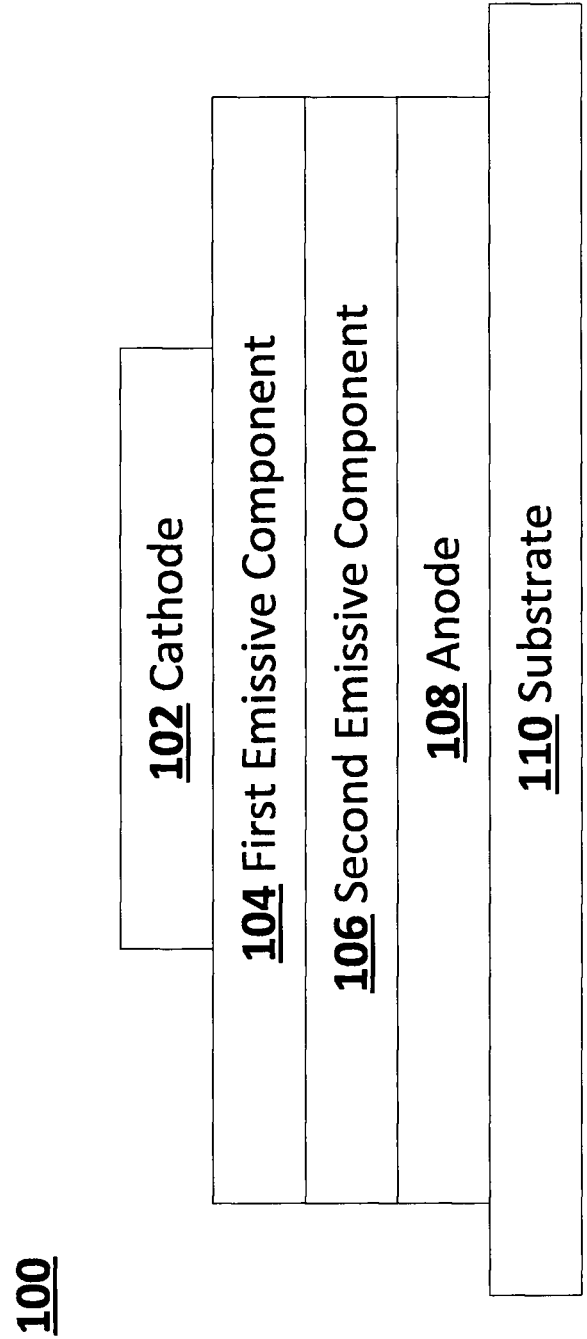
FIG. 1 is a cross-sectional view of an OLED device, according to some embodiments of the invention.

The present invention, in one aspect, provides a light emitting diode device which emits white or near-white light using a combination of an orange light emitting material and a blue light emitting material.

The combination of orange and blue light emission results in a white or near-white colored light whose light color may be adjustable using various combinations of the orange and blue lights.

A class of organic materials known as boron subphthalocyanines (BsubPcs) has been explored for use in WOLEDs, with a particular organic material, F5BsubPc, being representative of the general class of compounds and having been found to produce a light emission that is a perfect orange color with an extremely narrow wavelength distribution (as indicated by its peak width at half height). Types of BsubPCs that may be used include, but are not limited to, F12BsubPc, F17BsubPc, Br-F12BsubPc, Cl-BsubPc. Some embodiments of the present invention are not limited to F5BsubPc.

F5BsubPc is an alternative form of BsubPc with particular electronic properties compared to other BsubPcs (including Cl-BsubPc, phenoxy-BsubPcs and the like). F5BsubPc may function as an n-type charge carrier, as a p-type charge carrier and as an emitter.

WOLEDs may be produced using F5BsubPc in combination with an organic material that can emit a blue light to generate a white or near-white light. For example, F5BsubPc may be combined with a generic triarylamine (TPD) in a simple single emissive layer configuration to generate white light.

The orange electroluminescence of F5BsubPc enables the production of WOLEDs having a color spectrum (or color temperature) that may be tunable to range from that of a fluorescent bulb (cold, white) to that of an incandescent bulb (warm, orange-white). For example, the tuning of the emission may be conducted by adjusting the F5BsubPc:TPD ratio within the device to produce an orange-white emission similar to that of a traditional incandescent light bulb.

In some embodiments, the tuning is conducted during the manufacturing process by controlling the dopant levels of various components of a device. The ability to accurately tune the color spectrum of a produced WOLED during manufacture may be an important advantage as it provides greater flexibility in the potential applications and/or types of devices that can be manufactured using the same or similar raw materials. Further, another potential advantage is that the tuning may occur at the manufacturing stage and as the tuning is dopant level dependent, it may allow for more efficient, flexible and adaptive manufacturing processes.

The tuning required does not have to be proportional to the mass present, e.g. if one wished to move the emission 2% in one direction, that may not necessarily equate to a 2% change in composition. The tuning may involve identifying the target dopant level of one of the components and compensating the dopant level of the other components so that overall, the components generate a desired lighting output. The characteristics of the desired lighting output that may be adjusted for by tuning may, for example, include correlated color temperature, output light color, etc.

Tuning two compounds may provide an advantage as only tuning with two compounds along a line, instead of three in three-dimensional space, may provide greater ease of tuning than other implementations.

F5BsubPc may be incorporated into one or more OLEDs with varying device configurations, and it has been demonstrated that F5BsubPc has a potentially unique and pure orange electroluminescent emission with an unusually narrow peak width at half-height of 40 nm.

These WOLEDS may be fabricated for use in lighting applications, as well as odd-shaped and flexible shapes for various alternative applications.

Orange-white lighting has been perceived as being more pleasant to the human eye and has been shown to improve problem-solving ability and short-term memory.

Referring now to FIG. 1, a cross-sectional view of an OLED device, device 100 according to a first embodiment of this invention.

FIG. 1 provides a non-limiting example illustration of an embodiment of the invention. A person skilled in the art would understand that there are numerous configurations of the particular components of the device 100, and certain components may be omitted and/or merged with other components.

Device 100 is an OLED device comprising a cathode 102, a first emissive component 104, a second emissive component 106, an anode 108 and a substrate 110.

The first emissive component 104 and the second emissive component 106 are located between the anode 108 and the cathode 102. During operation, an appropriate voltage is applied between the anode 108 and the cathode 102, causing a current to flow between the anode 108 and the cathode 102. The emissive components 104 and 106 are comprised of particular materials that create a p-n junction. Similar to an ordinary light emitting diode, when the current flows, the electrons and holes recombine, emitting radiant energy in the form of light.

The above paragraph represents a simple embodiment of the invention. Those skilled in the art would recognize that additional layers might be present and/or necessary to make an optimally functional device. For example, a layer such as poly(3,4-ethylenedioxythiophene) poly(styrenesulfonate) (or PEDOT:PSS) may be included. The layer may be a conductive layer.

Further, a functional design may consist of multiple layers. The device 100 only provides a simple embodiment of an emitting layer. In accordance to some embodiments of the invention, a complete OLED device may be manufactured where one or more other layers may be included, in various configurations and designed for various applications.

The substrate 110 is a surface upon which the other components may be deposited. Various materials may be used for the substrate, including, but not limited to, glass (e.g. poly(3,4-ethylenedioxythiophene) poly(styrenesulfonate)) and plastics (e.g. polyethylene terephthalate). The substrate 110 may also be coated in indium tin oxide or other suitable transparent conductive oxides.

The first emissive component 104 is comprised of an electron transporting material. In some embodiments of the invention, the electron transporting material may comprise a host material doped with a fluorescent dopant emitter.

In some embodiments of the invention, the fluorescent dopant emitters may be either a boron subphthalocyanine (e.g. F5BsubPc) and any blue emissive material, such as a standard triarylamine or N,N'-diphenyl-N,N'-ditolyl-4,4'-diaminobiphenyl (TPD). A person skilled in the art would understand that there are a number of blue emitters available for selection.

If the fluorescent dopant emitter doped into the first emissive component 104 is a boron subphthalocyanine, the first emissive component 104 will emit an orange light. If the fluorescent dopant emitter doped into the first emissive component 104 is a blue emissive material, the first emissive component 104 will emit blue light.

The second emissive component 106 may be comprised of a hole transporting material. In some embodiments of the invention, the hole transporting material may comprise a host material doped with a fluorescent dopant emitter.

The selection of appropriate host materials may be beneficial in maintaining carrier balance.

If the fluorescent dopant emitter doped into the second emissive component 106 is F5BsubPc, the second emissive component 106 will emit an orange light. If the fluorescent dopant emitter doped into the second emissive component 106 is a blue emissive material, the second emissive component 106 will emit blue light.

The materials comprising first emissive component 104 and the second emissive component 106 are selected to have one component emit a blue light and the other component emit an orange light. The combination of the blue light and the orange light results in a white or near-white light.

In some embodiments of the invention, the particular ratio of blue light to orange light may be varied to adjust the 'whiteness' of the resultant white or near-white light. The ratio may be adjusted, for example, by varying the proportion of F5BsubPc:TPD.

As a non-limiting example, the resultant light may be tuned to provide lighting similar to that of the definitions of the standard illuminant profiles published by the International Commission on Illumination (CIE). The illuminant profiles include a number of white points, which, for example, pure white (0.33, 0.33) and incandescent (0.45118, 0.40594) may be found.

In some embodiments of the invention, the doping concentration may vary for both the first emissive component 104 and the second emissive component 106. As non-limiting examples, the doping concentration could be 1%, 5%, 10%, 20% or even 100%. Other percentages, ranges of percentages may also be considered. In some embodiments, the doping concentrations are selected to be complementary such that a light output may be tuned for having a set of desired characteristics, such as color, color temperature, etc.

In some embodiments of the invention, various host materials may be used for doping in the first emissive component 104 and the second emissive component 106.

Figure 2:
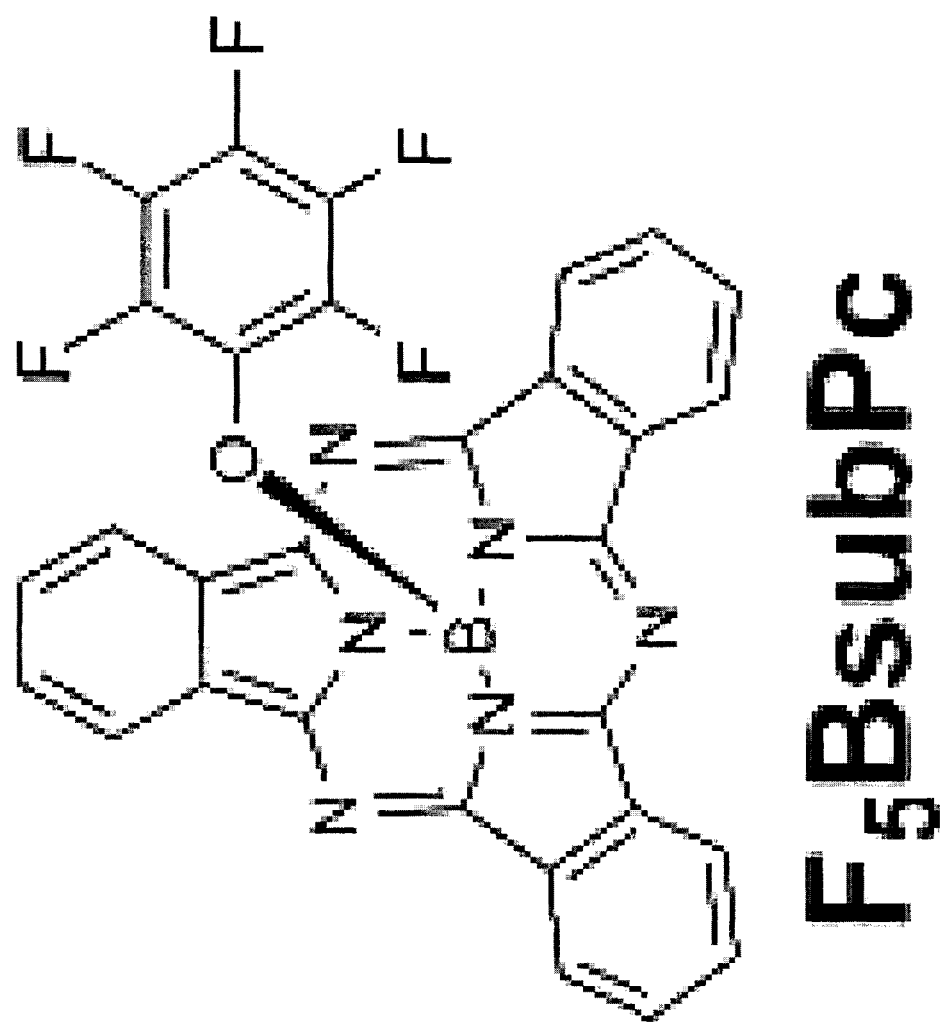
FIG. 2 is an illustration of the chemical structure of F5BsubPc, according to some embodiments of the invention.

Referring now to FIG. 2, an illustration of the chemical structure of F5BsubPc is shown. As indicated, F5BsubPc, a representative member the boron subphthalocyanine compounds is illustrated, but the invention is not limited to F5BsubPC.

Figure 3:
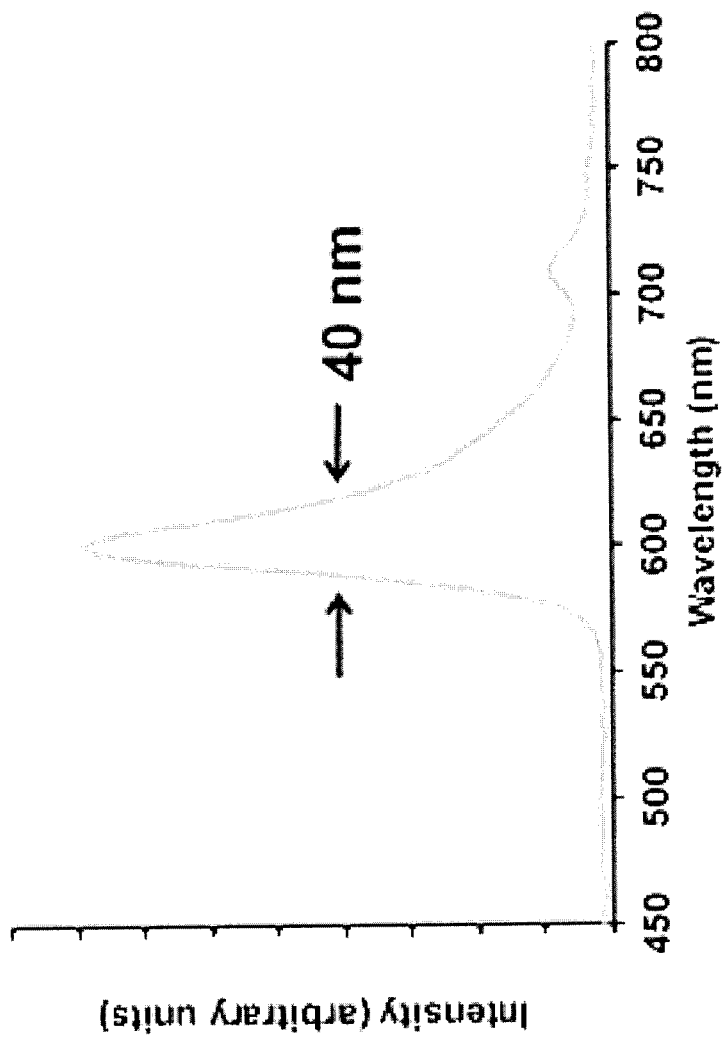
FIG. 3 is a sample graph indicating the intensity of the light emitted using F5BsubPc plotted against the wavelength of the light in nanometers, according to some embodiments of the invention.

Referring now to FIG. 3, a sample graph indicating the intensity of the light emitted using F5BsubPc plotted against the wavelength of the light in nanometers, according to some embodiments of the invention. The plotted graph indicates that the peak width at half-height is approximately 40 nm, and the peak intensity occurs at a wavelength of approximately 580 nm. It should be noted that this chart also indicates a second peak at around 715 nm—the device may also be engineered in such a way that the second peak is not expressed by the device.

Orange emitters are uncommon in the art, and are desirable due to their potential to combine with other lights to create 'warm' lights, such as warm orange tinted light. Orange emitters using boron subphthalocyanine compounds may also be less expensive or difficult to manufacture compared with other orange emitters known in the art, such as organometallic compounds based on rare and expensive metals such as palladium, platinum, iridium and osmium; the use of expensive and hard to synthesize quantum dots; and compounds requiring complex multistep organic synthesis. In these described cases, one may find that these cases may not have the narrow electroluminescent emission characteristic of F5BsubPc.

Figure 4:
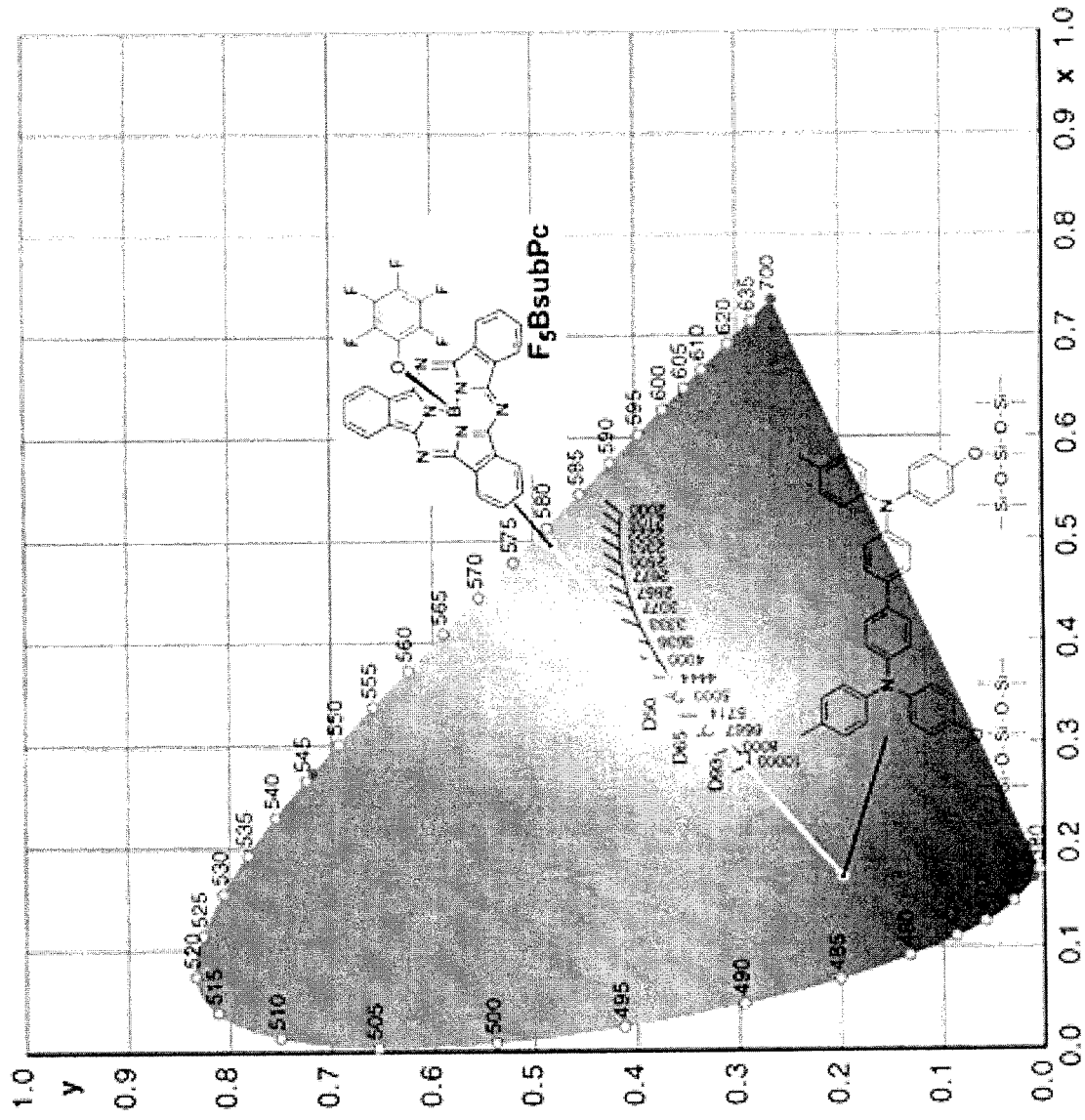
FIG. 4 is a sample plot indicating the range of the F5BsubPc electroluminescence and the range of colors achievable with the WOLED design, according to some embodiments of the invention.

Referring now to FIG. 4, a sample plot indicating the range of the F5BsubPc electroluminescence and the range of colors achievable with the WOLED design, according to some embodiments of the invention. The plot is superimposed over the Commission on Illumination (CIE) plot. The compound noted on the lower left of the plot is a blue emitter, which, according to this embodiment, is a representative TPD. The graph demonstrates different ratios of orange to blue light, with the ranges of light plotted across the white line near the centre of the CIE plot.

Figure 5:
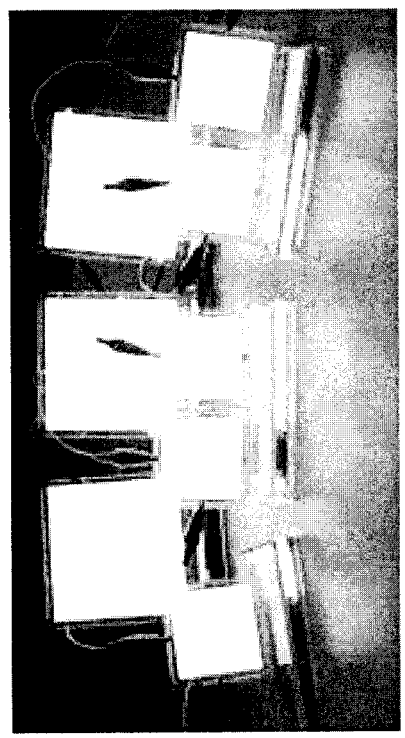
FIG. 5 includes sample photographs are provided that show other WOLED lights.

Referring now to FIG. 5, sample photographs are provided that show other designs of WOLED lights.

Figure 6:
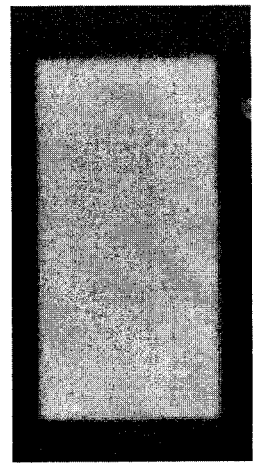
FIG. 6 includes sample photographs that show an OLED with F5BsubPc as the electroluminescent emitter, according to some embodiments of the invention.

Referring now to FIG. 6, sample photographs are provided that show an OLED with F5BsubPc as the electroluminescent emitter, according to some embodiments of the invention.

Referring now to FIG. 7, sample photographs are provided that show example applications of WOLED lights, according to some embodiments of the invention. FIG. 7(*a*) is a sample photograph showing of a flexible application of OLEDs, (*b*) is a sample photograph showing a potential OLED sign, (*c*) is a sample photograph showing a solar cell fabricated from BsubPcs.

Potential Applications

The market opportunity for white organic light emitting diode lighting (WOLED) can be best described by considering two potential segments:
  the lighting technologies that WOLED lighting could displace (see Displacements below).
  the ability of WOLED lighting to deploy lighting in ways not yet seen in building or architectural design (see New Opportunities below).

Displacements:

(a) General room interior lighting: Indoor lighting is comprised mainly of point sources of light from fluorescent sources, which have an emission spectrum that is white, and might be described as 'cold' and generally unpleasant light sources. Point sources of light are typically too bright to be looked at without stressing the eyes. Point source lighting is also generally not uniform and produces shadows and areas of non-uniform illumination with the illuminated space. This may be acceptable within residential housing but for an office environment shadows and areas of non-uniformity can cause unnecessary stress to the eyes.

Ceiling tiles may be made of WOLED lights that can be installed to cover the entire ceiling. Each WOLED is set to a lower brightness such that the sum of the luminance is equivalent to that achieved with traditional point source lighting. This makes the luminance of the individual panels less harsh to the eyes. Secondly, the fact that the entire ceiling is a light source means that there are no shadows and complete uniformity in the lighting of the space can be achieved. Finally, potentially due to the tune-ability of the warmth of light from the present invention, the light coming from these sources, utilizing BsubPcs, would be equivalent to a traditional incandescent light bulb, which has been described as warm, comfortable, and desirable (as outlined above in this proposal). Given the federal ban recently placed on incandescent light bulbs, WOLEDs of the type in the invention might be a suitable solution to continue to provide warm and comfortable lighting solutions to the marketplace.

This type of ceiling tile lighting system may be easily retrofitted into buildings which already have drop ceilings. They may also be readily incorporated into new building design. They could be as easily replaced as current ceiling tiles. Finally, initial calculations indicate that if certain metrics are achieved (turn on voltage, luminance efficiencies, lifetime) these lighting systems could save on electricity consumption. Additionally, with sufficiently long lifetimes, it can be anticipated that fewer labor hours would be required for light replacement (especially in hard to reach places). Labor costs and labor disruptions (for those occupying the space) are important considerations for large scale business, industrial and municipal lighting applications.

(b) Office furniture lighting: The second displacement envisioned is the wide deployment of WOLED lighting within the office environment and specifically the use of lighting fixtures in office furniture. Many versions of office furniture have lighting fixtures mounted under cabinetry or desktop. There may be the ability to easily construct a larger area WOLED light having identical spectrum to a traditional warm incandescent light bulb, thus allowing the deployment of lighting which is both warm and conducive to high productivity. It is possible that traditional desk lamps or under cabinetry lighting could be likely targets for WOLED lighting.

(c) Solar Panels: The technology can also be used for solar panels with a positive impact in the environment.

(d) Polyester Substrates: In one incarnation, between 80-95% of the mass of a WOLED is comprised of a flexible polyester substrate. Polyester is recyclable within current plastic recycling programs. Thus it is possible this type of WOLEDs could be recycled at end of life.

New Opportunities:

(a) Novel architectural features which do not normally 'light up' could be turned into novel sources of interior lighting. The first example we envision is a light wall. Similar to the light ceiling mentioned above, a wall covered entirely in WOLED lights would allow for illumination of an area with a warm uniform light. Additionally, owing to the ability to fabricate a WOLED on a flexible or moldable substrates, or alternatively mold the WOLED once fabricated, we envision that WOLEDs could be deployed around support posts and on curved or odd-shaped walls, again with the purpose of illuminating an area in a way not currently possible. Finally, one could make something resembling an artificial plant from WOLEDs, that could be deployed in a way so as to illuminate an area in an alternative way while having an eye-pleasing feature within an office or residential setting.

(b) Other novel applications: The interaction of artists and engineers has produced many of the modern buildings and devices that would be identifiable as cutting edge design in both architecture and industrial design respectively. Artists and architects (and their students), for example, may be engaged to consider applications with WOLED technologies, especially technologies which can be manufactured in multiple configurations, aside from flat panels or tiles. Applications with further decorative and artistic value may arise, designed for positive human factor design.

What is claimed is:

1. An organic light emitting diode device comprising:
    a first light emitting layer consisting essentially of boron subphthalocyanine that emits substantially orange light; and
    a second light emitting layer comprising an emissive material emitting blue light;
    a cathode; and
    an anode;
    wherein the boron subphthalocyanine and the emissive material emitting blue light, in combination, produces a white or near-white light emission,
    wherein the boron subphthalocyanine is capable of producing a light emission peak between 590 nm and 610 nm,
    wherein the first light emitting layer or the second light emitting layer comprises a hole transporting material for transporting holes,
    wherein the boron subphthalocyanine is F5BsubPc, and the emissive material emitting blue light comprises a standard triarylamine or TPD,
    wherein the anode, first light emitting layer, and second light emitting layer are the only layers that transports holes.

2. The organic light emitting diode device of claim 1, wherein the white or near-white light emission is either a white emission or an orange-white emission.

3. The organic light emitting diode device of claim 1, wherein relative amounts of the boron subphthalocyanine and the emissive material emitting blue light are adjustable to tune the spectrum of light.

4. The organic light emitting diode device of claim 3, wherein the relative amounts of the boron subphthalocyanine and the emissive material emitting blue light are adjustable to tune the spectrum of light from white to orange-white.

5. The organic light emitting diode device of claim 1, wherein the first emitting layer consists of the boron subphthalocyanine.

6. The organic light emitting diode device of claim 1, wherein the doping concentration of the emissive material emitting blue light is a percentage selected from a group consisting of 1%, 5%, 10%, 20% and 100%.

7. The organic light emitting diode device of claim 1, wherein said boron subphthalocyanine is used as an electron transporting material.

8. The organic light emitting diode device of claim 1, wherein said boron subphthalocyanine is used as the hole transporting material.

9. The organic light emitting diode of claim 8, wherein the first light emitting layer is an emissive hole transporting layer.

10. The organic light emitting diode device of claim 1, wherein said emissive material emitting blue light is used as an electron transporting material.

11. The organic light emitting diode device of claim 1, wherein said emissive material emitting blue light is used as the hole transporting material.

12. The organic light emitting diode device of claim 1, wherein the boron subphthalocyanine is F5BsubPc, and the emissive material emitting blue light consists of a standard triarylamine or TPD.

13. The organic light emitting diode device of claim 1, wherein the boron subphthalocyanine emits orange light with substantially orange colour characteristics having a narrow distribution.

14. The organic light emitting diode device of claim 1, wherein the boron subphthalocyanine operates as both an n-type charge carrier and as a fluorescent emitter.

15. A lighting system manufactured to include one or more organic light emitting diode devices of claim 1, wherein a light emitting layer is manufactured having relative amounts of the boron subphthalocyanine and the emissive material emitting blue light tuned to produce a warm, orange-tinted light.

16. The organic light emitting diode of claim 1, wherein F5BsubPc has a peak width at half-height of 40 nm.

17. The organic light emitting diode of claim 1, comprising a substrate coated with indium tin oxide or another transparent conductive oxide.

* * * * *